United States Patent
Huang et al.

(10) Patent No.: US 8,030,718 B2
(45) Date of Patent: Oct. 4, 2011

(54) LOCAL CHARGE AND WORK FUNCTION ENGINEERING ON MOSFET

(75) Inventors: Huan-Tsung Huang, Jhubei (TW); Shyh-Horng Yang, Hsinchu (TW); Yuri Masuoka, Jhubei (TW); Ken-Ichi Goto, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 51 days.

(21) Appl. No.: 12/424,170

(22) Filed: Apr. 15, 2009

(65) Prior Publication Data
US 2010/0065925 A1    Mar. 18, 2010

Related U.S. Application Data

(60) Provisional application No. 61/096,696, filed on Sep. 12, 2008.

(51) Int. Cl.
*H01L 29/76*    (2006.01)
(52) U.S. Cl. ........ 257/412; 257/410; 257/411; 257/407; 257/388; 257/364
(58) Field of Classification Search ............ 257/412, 257/411, 407, 410, 388, 364
See application file for complete search history.

(56) References Cited

U.S. PATENT DOCUMENTS

| 6,727,560 | B1 * | 4/2004 | Pan et al. ............. 257/412 |
| 6,861,712 | B2 * | 3/2005 | Gao et al. ............. 257/369 |
| 6,921,711 | B2 * | 7/2005 | Cabral et al. .......... 438/589 |
| 7,361,561 | B2 | 4/2008 | Goolsby et al. |
| 2003/0216038 | A1 * | 11/2003 | Madhukar et al. ...... 438/648 |
| 2006/0008968 | A1 * | 1/2006 | Brask et al. .......... 438/206 |
| 2006/0278934 | A1 * | 12/2006 | Nagahama ............. 257/369 |

FOREIGN PATENT DOCUMENTS
CN    1881590    12/2006

OTHER PUBLICATIONS
Chinese Patent Office, Office action dated Jul. 14, 2010, Application No. 200910169146.8, 5 pages.

* cited by examiner

*Primary Examiner* — Long Pham
(74) *Attorney, Agent, or Firm* — Haynes and Boone, LLP (57) ABSTRACT

The present disclosure provides a semiconductor device. The semiconductor device includes a semiconductor substrate having a source region and a drain region, defining a first dimension from the source to drain; and a gate stack disposed on the semiconductor substrate and partially interposed between the source region and the drain region. The gate stack includes a high k dielectric layer disposed on the semiconductor substrate; a first metal feature disposed on the high k dielectric layer, the first metal gate feature having a first work function and defining a second dimension parallel with the first dimension; and a second metal feature having a second work function different from the first work function and defining a third dimension parallel with the first dimension, the third dimension being less than the second dimension.

14 Claims, 8 Drawing Sheets

LOCAL CHARGE AND WORK FUNCTION ENGINEERING ON MOSFET

PRIORITY DATA

This application claims priority to Provisional Application Ser. No. 61/096,696 filed on Sep. 12, 2008, entitled "Local Charge and Work Function Engineering on MOSFET", the entire disclosure of which is incorporated herein by reference.

BACKGROUND

When a semiconductor device such as a metal-oxide-semiconductor field-effect transistors (MOSFETs) is scaled down through various technology nodes, high k dielectric material and metal are adopted to form a gate stack. When forming such a device, the metal layer is tuned to have a proper work function to achieve the designed threshold voltage of the device. Currently, the threshold voltage (Vt) is controlled and engineered by tuning work function of entire gate region. The band edge work function is preferred to have good short channel control while tuning Vt (threshold voltage) by implanting impurities (dopants) into the device channel. However, both the short channel control and Vt target cannot be tuned independently and may not be met at the same time. Therefore, a structure and the method making the same are needed for additional freedom of tuning both the short channel effect and threshold voltage.

SUMMARY

One of the broader forms of an embodiment of the present invention involves a semiconductor device. The semiconductor device includes a semiconductor substrate having a source region and a drain region, defining a first dimension from the source to the drain; and a gate stack disposed on the semiconductor substrate and partially interposed between the source region and the drain region. The gate stack includes a high k dielectric layer disposed on the semiconductor substrate; a first metal feature disposed on the high k dielectric layer, the first metal feature having a first work function and defining a second dimension parallel with the first dimension; and a second metal feature having a second work function different from the first work function and defining a third dimension parallel with the first dimension, the third dimension being less than the second dimension.

Another one of the broader forms of an embodiment of the present invention involves a semiconductor device. The semiconductor device includes a high k dielectric layer disposed on a semiconductor substrate; a first metal feature having a first work function and disposed on the high k dielectric layer; a second metal feature having a second work function different from the first work function and embedded in the first metal feature; and a gate electrode disposed on the second metal feature.

Yet another one of the broader forms of an embodiment of the present invention involves a method of making semiconductor device having metal gate stacks. The method includes forming a high k dielectric layer on a semiconductor substrate; forming a first metal layer on the high k dielectric layer; forming a dummy gate electrode on the first metal layer; patterning the dummy gate electrode, the first metal feature, and the high k dielectric layer to form a dummy gate stack such that the first metal feature is extruded horizontally to channel edges; forming a light doped drain (LDD) features in the semiconductor substrate; forming a spacer on sidewalls of the dummy gate stack; forming source and drain regions; forming an inter-level dielectric (ILD) layer on the semiconductor substrate; performing a chemical mechanical polishing (CMP) process; removing the dummy gate electrode thereby forming a gate trench; forming a second metal feature in the gate trench; and forming a gate electrode on the second metal feature.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
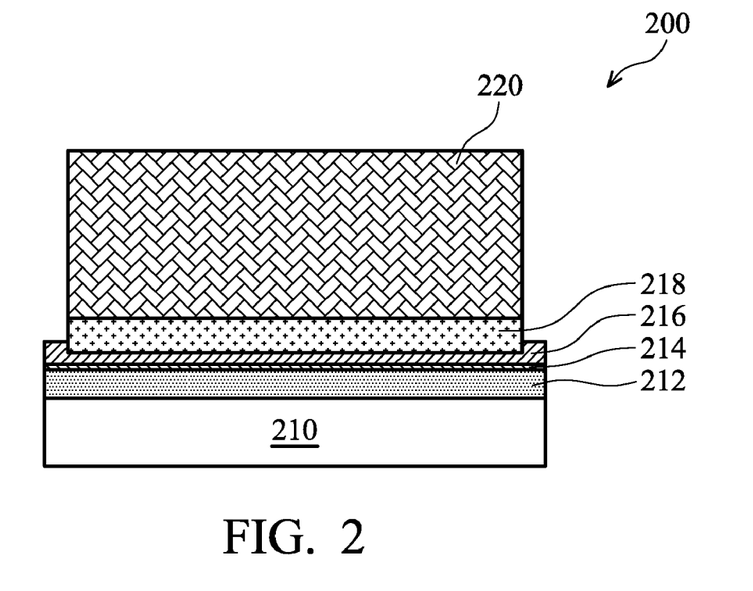
FIGS. 2 through 4 are sectional views of a semiconductor device having a metal gate structure constructed according to aspects of the present disclosure in various embodiments.
Figure 3:
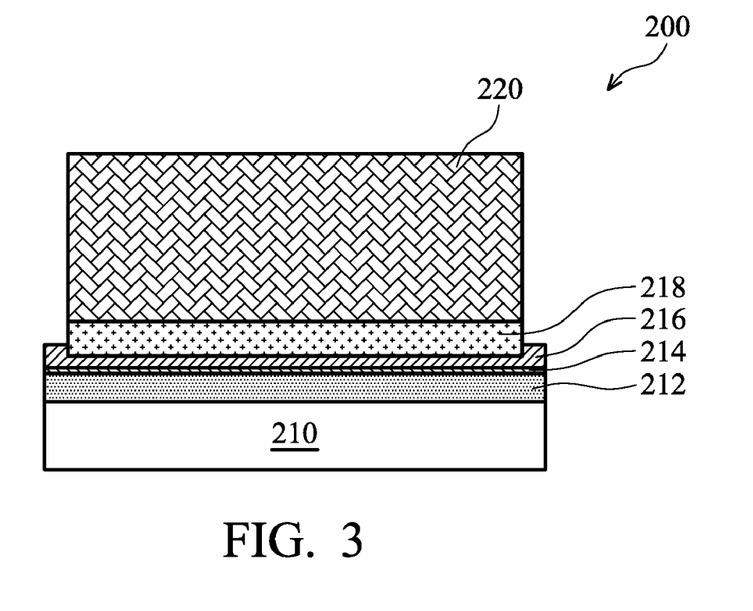
Figure 4:
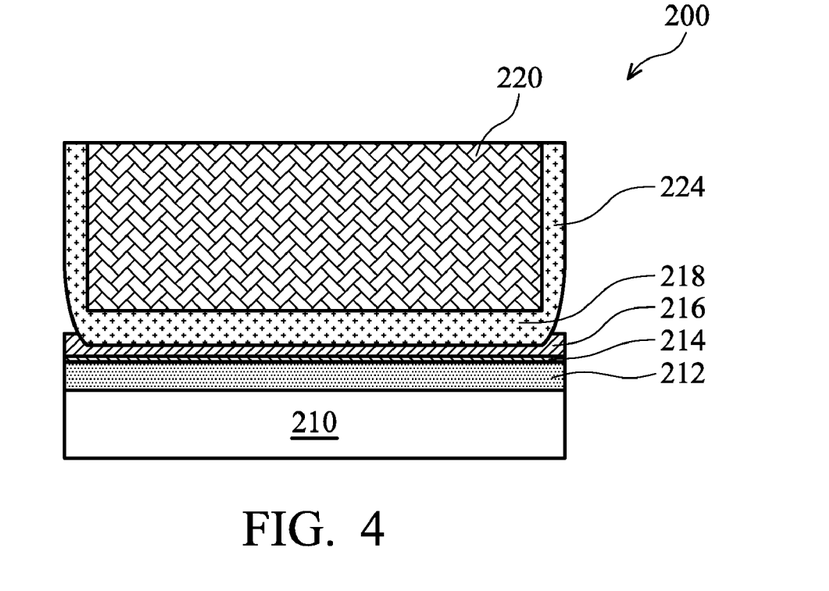

FIGS. 2 through 4 are sectional views of a semiconductor device 200 having a metal gate structure constructed according to aspects of the present disclosure in various embodiments. The semiconductor device 200 includes a semiconductor substrate 210. The substrate includes silicon. The substrate further includes various isolation features, such as shallow trench isolation (STI), and various doped features, such as a source, a drain, light doped drain (LDD) features, a channel region interposed between the source and the drain.

The device 200 further include a gate stack formed on the semiconductor substrate 210, overlying the channel region. The gate stack includes a high k dielectric material layer 212. The high k dielectric material layer 214 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

The gate stack may additionally include a buffer material layer (capping layer) 214 disposed on the high k dielectric material layer. The capping layer 214 is interposed between the high k dielectric material layer and the metal gate layer. The buffer layer includes lanthanum oxide (LaO). The capping layer may alternatively includes other suitable material, such as aluminum oxide (Al2O3).

The gate stack further includes a gate-first metal feature (GF metal or first metal feature) 216 formed by a gate-first method. The GF metal 216 has a first work function. In one embodiment, the first work function of the GF metal is close to the midgap. In one example, the GF metal includes titanium nitride. In another example, the GF metal includes tantalum nitride, molybdenum nitride, tungsten nitride, tungsten, tantalum carbide, tantalum carbide nitride, titanium aluminum nitride or a combination, tuned to have the first work function. In another example, the GF metal includes a metal doped with other impurities, such as oxygen and/or nitrogen. The GF metal 216 can be formed by PVD or other suitable process.

The gate stack further includes a gate-last metal feature (GL metal or second metal feature) 218 formed by a gate-last method. The GL metal 218 has a second work function designed to be different from the first work function. In one embodiment, the second work function of the GL metal is close to the band edge. In one example, the GL metal includes titanium nitride with different nitrogen concentration. In another example, the GF metal includes tantalum nitride, molybdenum nitride, tungsten nitride, tungsten, tantalum carbide, tantalum carbide nitride, titanium aluminum nitride or a combination, tuned to have the second work function. In another example, the GF metal includes a metal doped with other impurities, such as oxygen and/or nitrogen, tuned to have the second work function. The GL metal 218 can be formed by PVD or other suitable process.

The gate stack further include a gate electrode 220 disposed on the GL metal feature 218. The gate electrode 220 includes a conductive material. In one example, the gate electrode include tungsten. In other examples, the gate electrode may include aluminum or other suitable metal. The gate electrode is formed by physical vapor deposition (PVD) method or other suitable method, such as plating.

The GF metal 216 and GL metal 218 are configured such that the GF metal has an extruded feature extruded from the gate stack and adjacent the edges of the channel region. The GL metal is embedded in the extruded feature of the GF metal, overlying the channel region of the substrate. The GL metal is partially interposed between the extruded feature of the GF metal. By such a configuration, the GF metal with the first work function is tuned to control the threshold voltage of the device. The GL metal with the second work function is tuned to eliminate short channel effect.

In one embodiment as illustrated in FIG. 2, the GF metal is substantially free between the GL metal and the underlying material layer (the buffer layer in this case). In another embodiment as illustrated in FIG. 3, the GL metal is partially embedded in the GF metal such that the GF metal includes a portion interposed between the GL metal and the underlying material layer (the buffer layer in this case). In another embodiment as illustrated in FIG. 4, a seal spacer 224 is formed on the sidewalls of the gate stack, overlying the extruded feature of the GF metal and sealing the gate stack for protection.

The device 200 may include other features. For example, the gate stack may include an interfacial layer, such as a thin silicon oxide layer, interposed between the substrate 210 and the high k dielectric material layer. The thin silicon oxide layer may be formed by atomic layer deposition (ALD) or thermal oxidation. In one example, the device 200 is a field-effect transistor (FET). Inn furtherance of the example, the device is a metal-oxide-semiconductor FET (MOSFET) with a metal gate stack. The metal gate stack includes a first metal feature having a first work function tunable to the channel edges and a second metal feature having a second work function tunable to the channel region.

Figure 1:
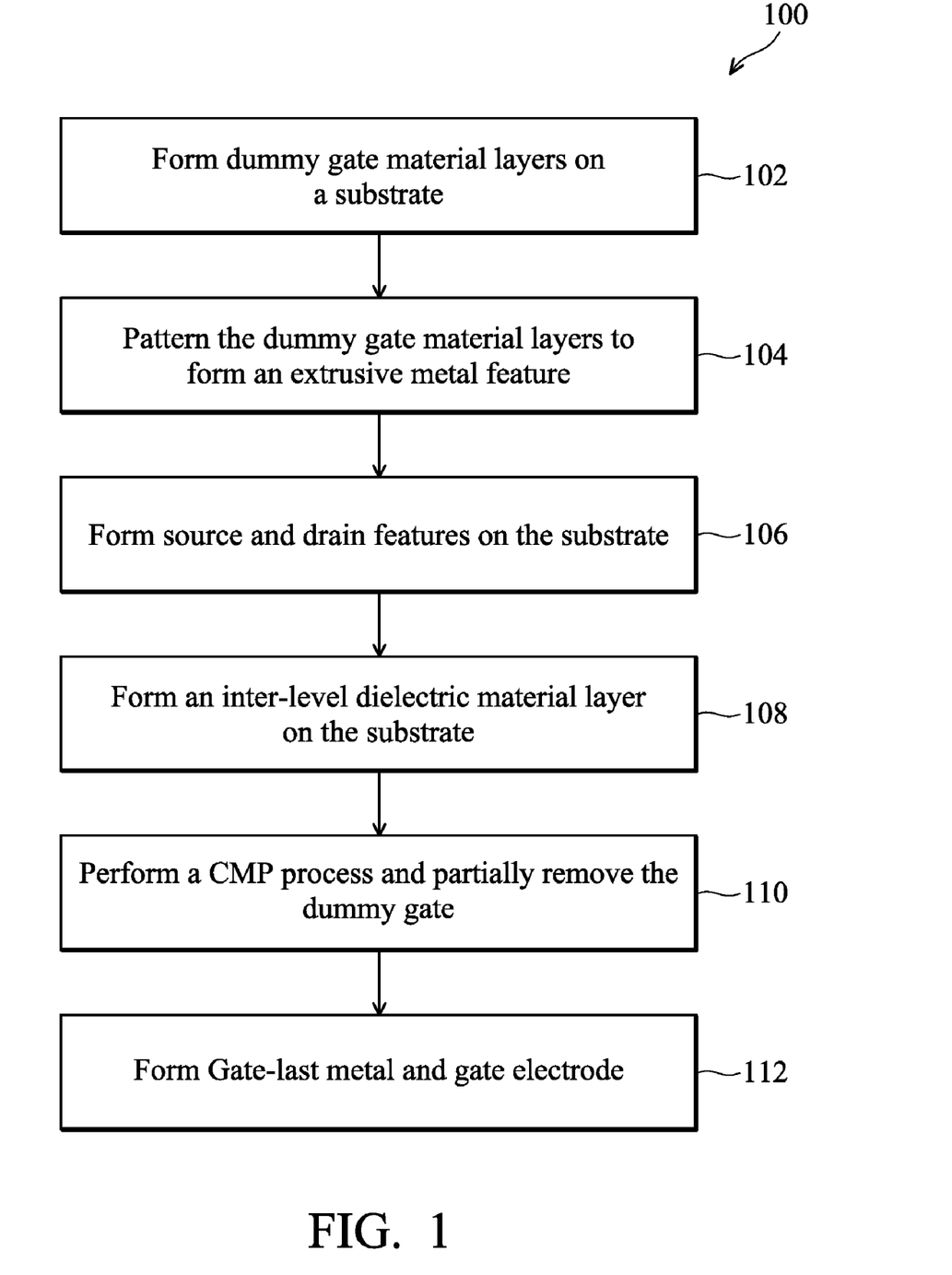
FIG. 1 is a flowchart of a method for making a semiconductor device having a metal gate structure constructed according to aspects of the present disclosure.

FIG. 1 is a flowchart of a method 100 for making a semiconductor device having a metal gate structure constructed according to aspects of the present disclosure. FIGS. 5 through 10 are sectional views of one embodiment of a semiconductor 206 structure having a metal gate structure at various fabrication stages constructed according to various aspects of the present disclosure. FIGS. 11 through 14 are sectional views of another embodiment of a semiconductor structure having a metal gate structure at various fabrication stages constructed according to various aspects of the present disclosure. The method 100 of making the semiconductor device 200 or 206 is described below with reference to FIGS. 1 and 5 through 14.

Figure 5:
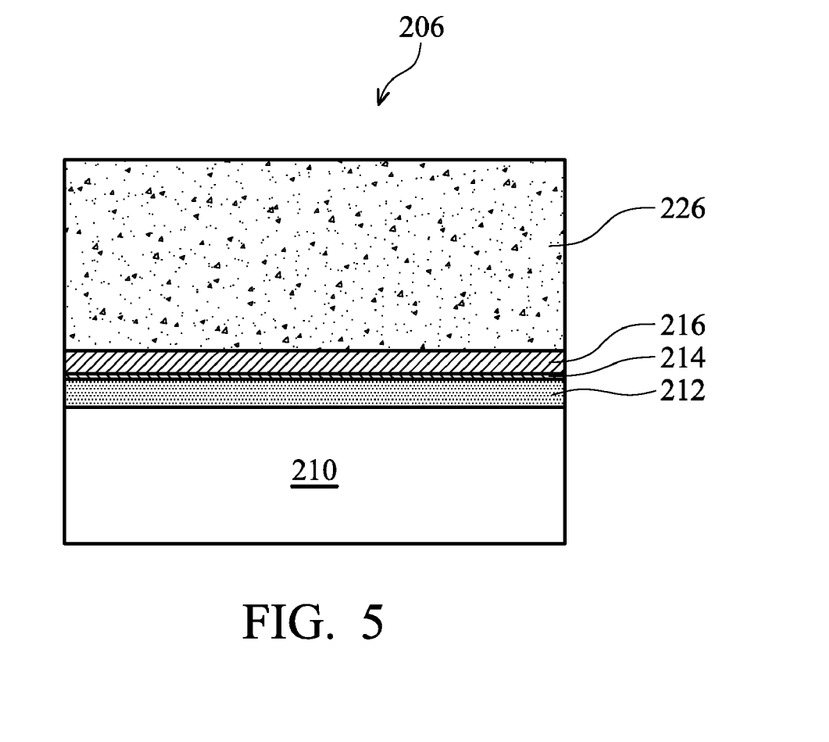
FIGS. 5 through 10 are sectional views of one embodiment of a semiconductor structure having a metal gate structure at various fabrication stages constructed according to various aspects of the present disclosure.

Referring to FIGS. 1 and 5, the method 100 begins at step 102 by forming various gate material layers on a semiconductor substrate 210. The semiconductor substrate 210 includes silicon. Alternatively, the substrate 210 includes germanium, silicon germanium or other suitable semiconductor material. In other embodiments, the substrate 210 may use another semiconductor material such as diamond, silicon carbide, gallium arsenic, GaAsP, AlInAs, AlGaAs, GaInP, or other proper combination thereof.

In one embodiment, a high k dielectric material layer 212 is formed on the semiconductor substrate 210. The high k dielectric material layer 212 is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. Alternatively, the high k dielectric material layer includes metal nitrides, metal silicates or other metal oxides.

A buffer layer (capping layer) 214 may be formed on the high k dielectric material layer 212. The capping layer 214 includes lanthanum oxide (LaO) in one example. The capping layer may alternatively include other suitable material, such as aluminum oxide.

A first metal layer (gate-first metal layer or GF metal) 216 is formed on the capping layer 214. The metal gate layer 216 is formed by PVD or other suitable process. The metal gate layer includes titanium nitride. In another embodiment, the metal gate layer may include tantalum nitride, molybdenum nitride, tungsten nitride, tungsten, tantalum carbide, tantalum carbide nitride, titanium aluminum nitride or a combination thereof. The metal layer 216 is tuned to have a first work function close to the midgap.

A dummy gate electrode layer 226 is formed on the first metal layer 216. In one embodiment, the dummy gate electrode layer include polysilicon. An interfacial layer (IL) may be additionally formed on the substrate and is interposed between the semiconductor substrate 210 and the high k dielectric material layer 212. The interfacial layer includes a thin silicon oxide layer in one example. The thin silicon oxide is formed on the substrate 210 before forming the high k dielectric material layer. The thin silicon oxide layer may be formed by atomic layer deposition (ALD) or thermal oxidation.

Figure 6:
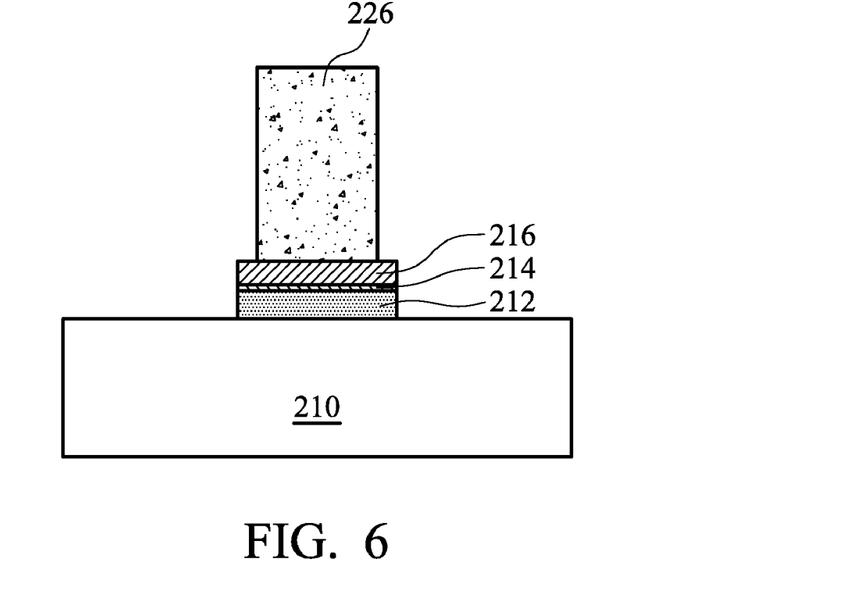

The method 100 proceeds to step 104 by patterning the various gate material layers to form a dummy gate stack as illustrated in FIG. 6. In one embodiment, a patterned photoresist layer is formed on the multiple metal-gate-stack layers. The patterned photoresist layer 222 is formed on the gate material layers and is used as a mask to form the dummy gate stack. In this case, the patterned photoresist is formed on the polysilicon layer 226. The patterned photoresist layer is formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. Alternatively, a hard mask patterned may be formed as a mask to pattern the dummy gate stack. In this case, the a hard mask layer is deposited on the substrate and then is patterned using a patterned photoresist layer by a lithography process and an etching process.

The dummy gate electrode layer, the first metal layer, the high k dielectric material layer within the openings of the patterned mask (photoresist or hard mask) are removed by a first etching process. In one embodiment, the first etching process utilizes a dry etching process. In one example, the dry etching process implements a fluorine-containing plasma to remove the polysilicon. For example, the etch gas includes CF4. Alternatively, the first etching process may include multiple etching steps to etch the gate material layers. In another embodiment, the first etching process also etches the buffer layer if present.

The formed dummy gate stack includes an extruded metal portion of the first metal layer 216, extruding out from the gate stack as illustrated in FIG. 6. In one embodiment, a second etching process may be employed to form the extruded metal feature. As an example, the second etching process includes a wet etching process designed to selectively remove the dummy gate electrode such that the dummy gate electrode is shrunk and the extruded metal feature is exposed.

Figure 7:
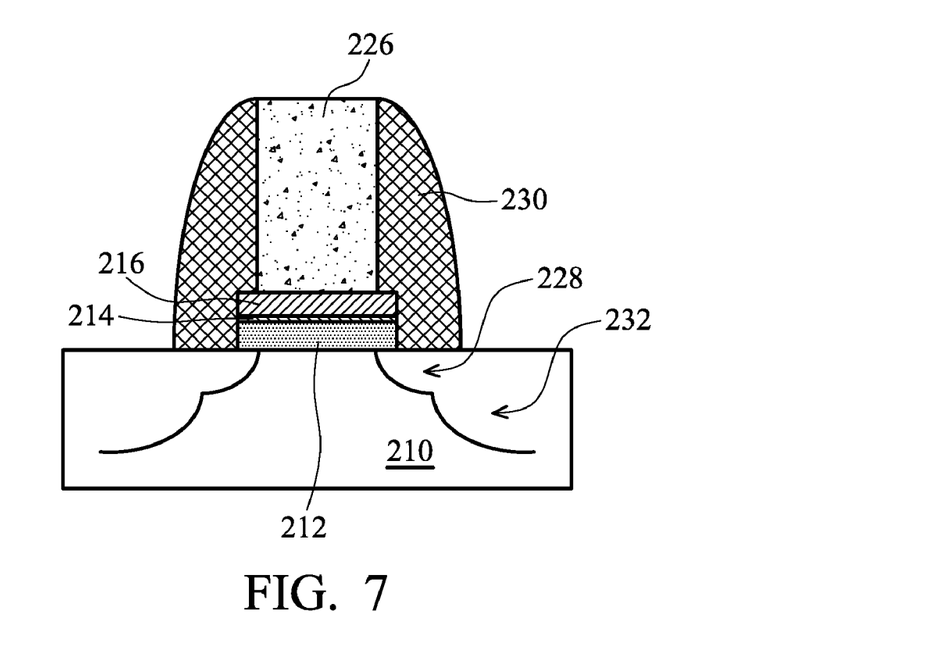
Figure 11:
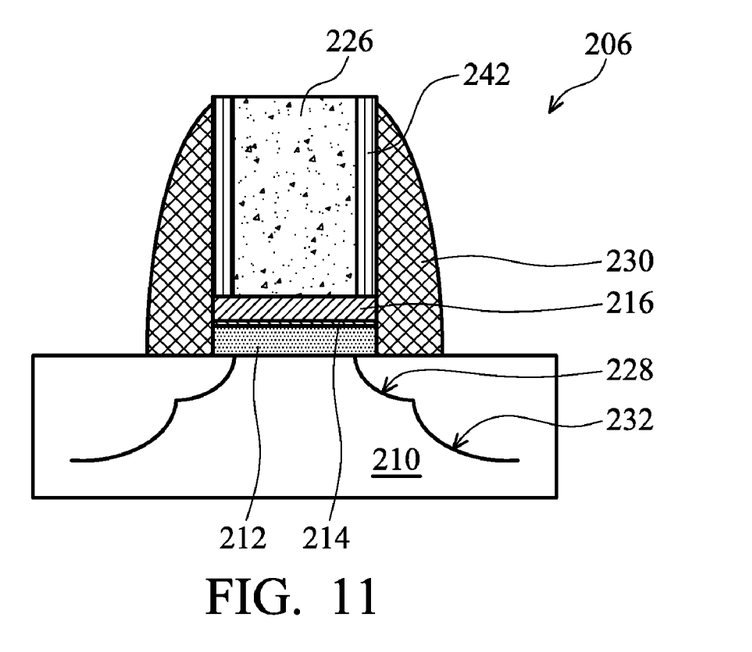
FIGS. 11 through 14 are sectional views of another embodiment of a semiconductor structure having a metal gate structure at various fabrication stages constructed according to various aspects of the present disclosure.
Figure 12:
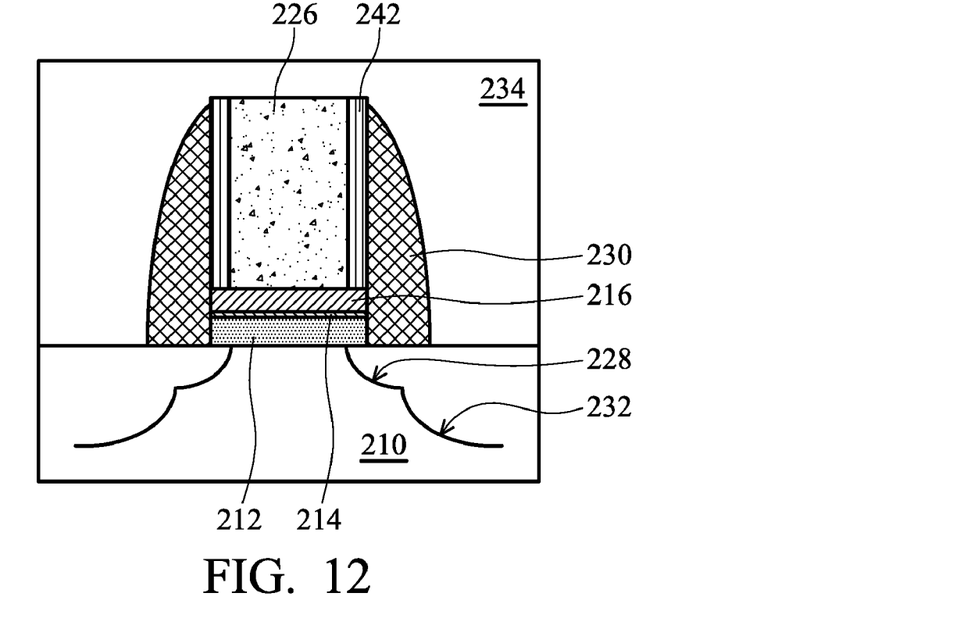
Figure 13:
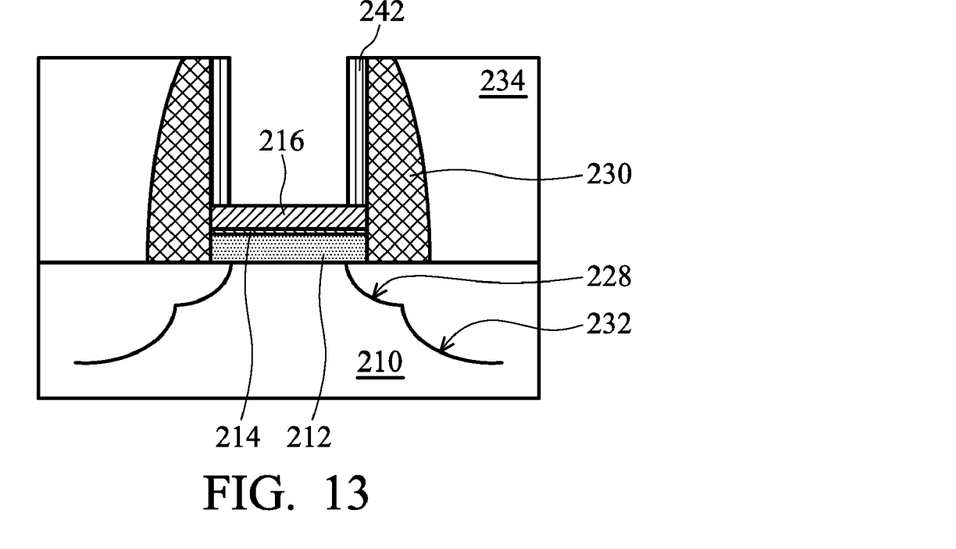
Figure 14:
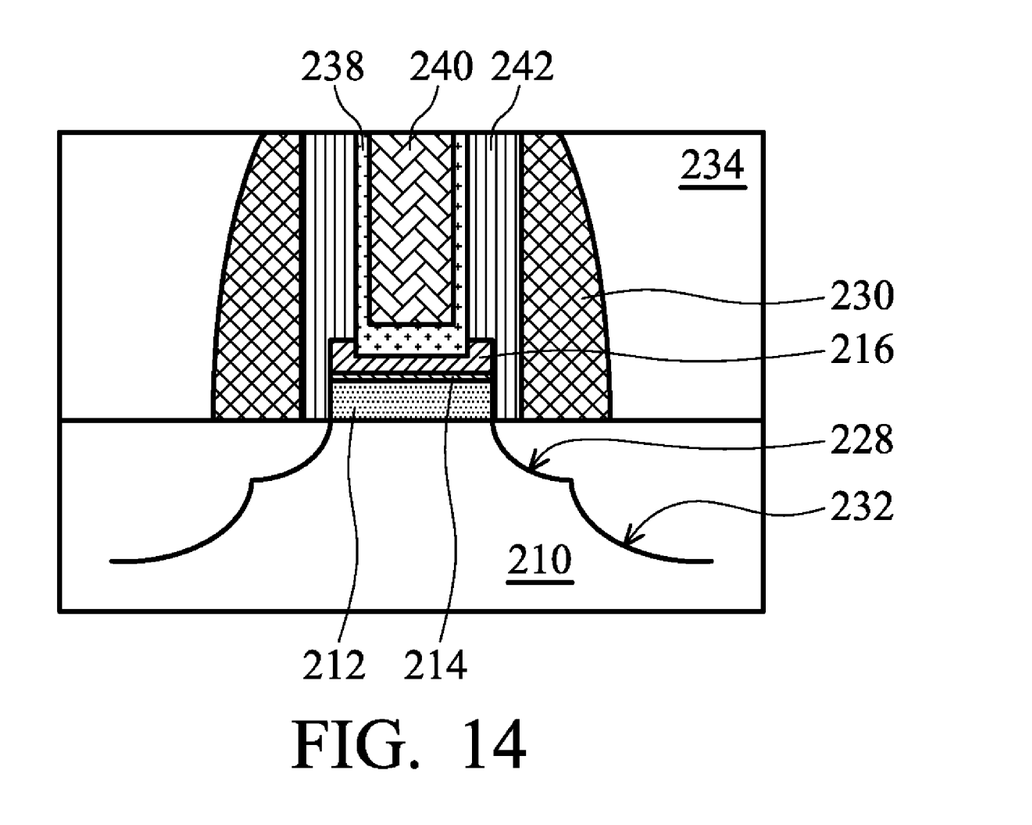

The method 100 proceeds to step 106 by forming various transistor features as illustrated in FIG. 7. A light doped drain (LDD) regions 228 are formed by an ion implantation process using the dummy gate stack as an implanting mask. A seal spacer 242 may be formed on the sidewalls of the dummy gate stack to seal the high k dielectric material layer and the first metal and to protect thereof, as illustrated in FIG. 11.

Then a spacer 230 is formed on the sidewalls of the gate stack (or the sidewalls of the seal spacer if present) by a technique known in the art. For example, the spacer includes silicon nitride and is formed by a chemical vapor deposition (CVD) and a dry etching process. Then source/drain regions 232 are formed in the substrate by another ion implantation process.

Figure 8:
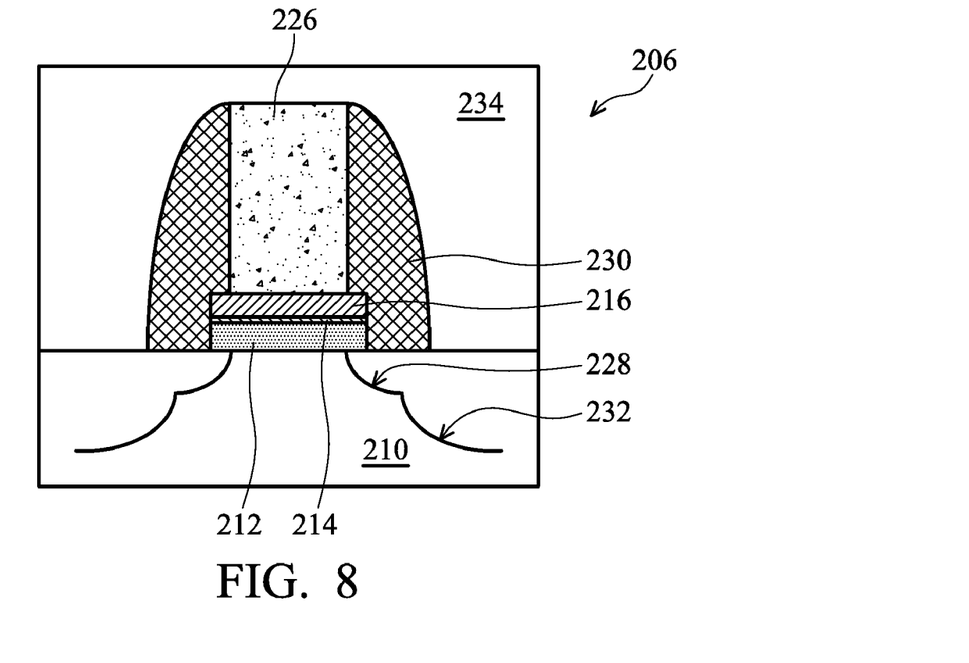

The method 100 proceeds to step 108 by forming an inter-level dielectric (ILD) layer 234 on the substrate as illustrated in FIG. 8. The ILD layer includes silicon oxide, low k material layer or other suitable dielectric material, formed by CVD or other suitable method. For example, the ILD layer is formed by a high density plasma CVD. The ILD layer is disposed on the substrate between the multiples dummy gate stacks and on the dummy gate stacks.

The method 100 proceeds to step 110 by performing a chemical mechanical polishing (CMP) process to polish the ILD layer 234 and reduce the thickness of the ILD layer to expose the dummy gate electrode 226. If the hard mask is present, the CMP process may remove the hard mask layer as well or an additional wet etching process is applied to selectively remove the hard mask.

Figure 9:
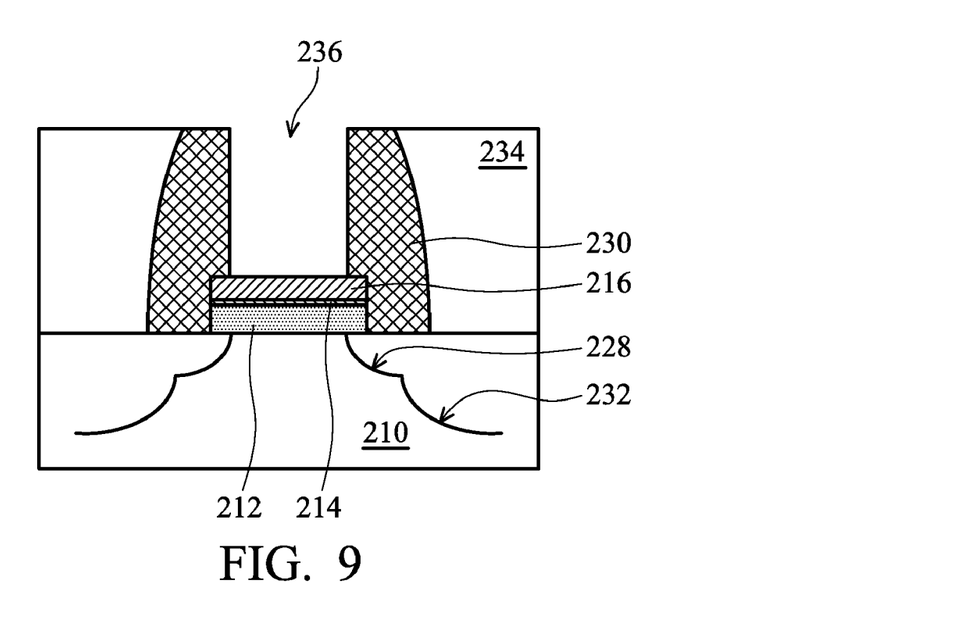
Figure 10:
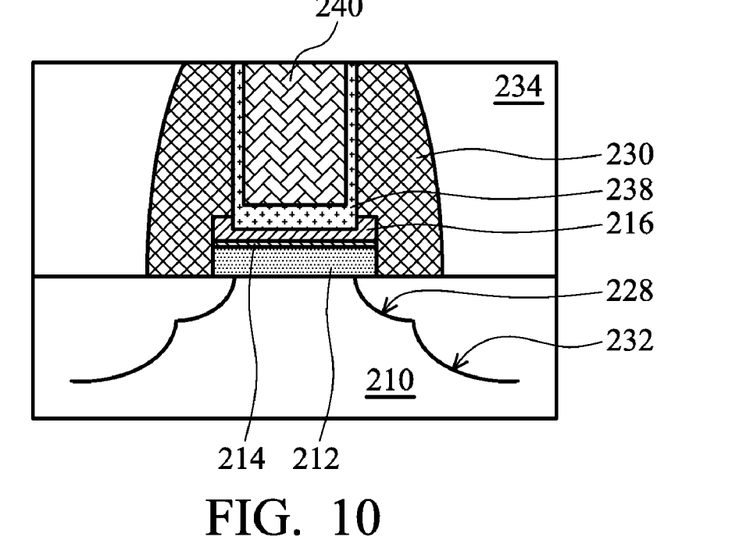

The method 100 proceeds to step 112 by forming a gate-last metal feature 238 and a gate electrode 240. First, the dummy gate electrode is removed by an etching process, resulting in a gate trench 236 as illustrated in FIG. 9. Then a gate-last metal layer (second metal feature or GL metal) 238 is formed in the gate trench 236. The GL metal layer is disposed on the bottom of the gate trench and may also formed on the sidewalls of the gate trench. In one example, the GL metal 238 is formed on the first metal feature 216. In another example, the first metal feature 216 is partially removed by an additional etching process or the same etching process to remove the dummy gate electrode. The first metal feature within the gate trench is partially removed such that the first gate feature within the gate trench has a reduced thickness. In another example, the first metal feature within the gate trench is completely removed by the additional etching process such that the underlying material layer (the high k dielectric material layer or the capping layer) is exposed. In either case, the extruded portion of the first metal feature remains and is embedded in the spacer (or the seal spacer). Then the GL metal 238 is embedded in the first metal feature as illustrated in FIG. 10. The gate electrode 240 is formed on the GL metal layer and is filled in the gate trench. The gate electrode 240 includes a conductive material, such as tungsten, aluminum or other suitable metal. Another CMP process may be followed to polish the substrate and remove the excessive gate electrode material and second metal layer formed on the gate stack and the ILD layer. FIGS. 5, 6 and 11 through 14 illustrate other embodiment of the semiconductor device 106 at various fabrication stages with a method similar to the method 100. In this case, the seal spacer 242 is additionally formed on the sidewalls of the gate stacks.

Although not shown, other processing step may present to form various doped regions such as n-wells and p-wells, devices features such as multilayer interconnection (MLI). In one embodiment, the multilayer interconnection are further formed. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

In another embodiment, the isolation features in the substrate may include shallow trench isolation (STI). The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

In another example, the metal layers for an n-type MOS transistor is different from the metal layers of the p-type MOS with tuned work functions. In another example, the gate spacers may have a multilayer structure and may include silicon oxide, silicon nitride, silicon oxynitride, or other dielectric material. N-type dopant impurities employed to form the associated doped regions may include phosphorus, arsenic, and/or other materials. P-type dopant impurities may include boron, indium, and/or other materials.

The present disclosure is not limited to applications in which the semiconductor structure includes a MOS transistor, and may be extended to other integrated circuit having a metal gate stack. For example, the semiconductor structure 200 may include a dynamic random access memory (DRAM) cell, a single electron transistor (SET), and/or other microelectronic devices (collectively referred to herein as microelectronic devices). In another embodiment, the semiconductor device 200 includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. For example, the semiconductor substrate may include an epitaxial layer. For example, the substrate may have an epitaxial layer overlying a bulk semiconductor. Further, the substrate may be strained for performance enhancement. For example, the epitaxial layer may include a semiconductor material different from those of the bulk semiconductor such as a layer of silicon germanium overlying a bulk silicon, or a layer of silicon overlying a bulk silicon germanium formed by a process including SEG. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

The disclosed method and device structure the first metal feature at channel edge and the second metal feature on the channel, each can be separately tuned to have an individual work function such that the short channel effect and the threshold voltage can be controlled independently.

Thus, the present disclosure provides an integrated circuit having metal gate stacks. The integrated circuit includes a semiconductor substrate having a source region and a drain region, defining a first dimension from the source to drain; and a gate stack disposed on the semiconductor substrate and horizontally partially interposed between the source region and the drain region. The gate stack includes a high k dielectric layer disposed on the semiconductor substrate; a first metal feature disposed on the high k dielectric layer, the first metal gate feature having a first work function and defining a second dimension parallel with the first dimension; and a second metal feature having a second work function different from the first work function and defining a third dimension parallel with the first dimension being less than the second dimension.

According to one or more embodiments of the disclosed device, the first work function is close to a mid gap of an energy band. The second work function may be close to a band edge of an energy band. The second metal feature may be disposed on the first metal feature. The second feature may be partially embedded in the first metal feature. The first metal feature is formed by a gate-first method. The second metal feature is formed by a gate-last method. The device may further include a gate electrode disposed on the second metal feature. The device may further include a first spacer formed on sidewalls of the gate stack. The device may further include a seal spacer interposed between the gate stack and the first spacer and being functional to seal the high k dielectric material layer and the first metal feature. The device may further include a buffer layer interposed between the high k dielectric material layer and the first metal feature. The device may further include an interfacial layer interposed between the semiconductor substrate and the high k dielectric material layer.

The present disclosure also provides another embodiment of a semiconductor device. The device includes a high k dielectric layer disposed on a semiconductor substrate; a first metal feature having a first work function and disposed on the high k dielectric layer; a second metal feature having a second work function different from the first work function and embedded in the first metal feature; and a gate electrode disposed on the second metal feature.

In the disclosed device, the first metal feature is horizontally extruded from the gate electrode. The device further includes a seal spacer formed on the extrude portion of the first metal feature and on sidewalls of the first metal feature and the gate electrode. The device may further include another spacer formed on outer sidewalls of the seal spacer. The second metal feature may be adjacent the high k dielectric material layer. The first metal feature is formed by a gate-first method. he second metal feature is formed by a gate-last method. The device may further include an interfacial layer interposed between the semiconductor substrate and the high k dielectric material layer. The device further includes a source and a drain formed in the semiconductor substrate and interposed by the first and second metal features. The device includes a field-effect transistor (FET).

The present disclosure also provides an embodiment of a method for making a semiconductor device having metal gate stacks. The method includes forming a high k dielectric material layer on a semiconductor substrate; forming a first metal layer on the high k dielectric material layer; forming a dummy gate electrode on the first metal layer; patterning the dummy gate electrode, the first metal feature and the high k dielectric material layer to form a dummy gate stack, such that the first metal feature is extruded horizontally to channel edges; forming a light doped drain (LDD) features in the semiconductor substrate; forming a spacer on sidewalls of the dummy gate stack; forming source and drain regions; forming an inter-level dielectric (ILD) material layer on the semiconductor substrate; performing a chemical mechanical polishing (CMP) process to the semiconductor substrate; removing the dummy gate electrode, resulting a gate trench; forming a second metal feature on the gate trench; and forming a gate electrode on the second metal feature.

The method may further include forming an interfacial layer on the semiconductor substrate before the forming the high k dielectric material layer. The method may further include forming a buffer layer before the forming the high dielectric material layer. The patterning step may further include applying a dry etching process to etch the dummy gate electrode, the first metal feature and the high k dielectric material layer; and applying a wet etching process to selectively and partially remove the dummy gate electrode such that the first metal feature is extruded from the dummy gate stack. The forming the dummy gate electrode may include forming a polysilicon dummy electrode feature. The method may further include forming a seal spacer on the sidewalls of the dummy gate stack before the forming the spacer. The method may further include partially removing the first metal feature in the gate trench after the removing the dummy gate electrode and before the forming the second metal feature. The removing the first metal feature may include removing the first metal feature such that a portion of the first metal feature in the gate trench is completed removed.

The present disclosure also provides another embodiment of a method for making a semiconductor device having metal gate stacks. The method includes forming dummy gate material layers on a substrate; patterning the dummy gate material layers to form a dummy gate stack and an extruded metal feature; forming source and drain features on the substrate; forming an inter-level dielectric (ILD) material layer on the substrate; performing a chemical mechanical polishing (CMP) process to the substrate; removing the dummy gate stack, resulting a gate trench; and forming a gate-last metal feature interposed between the extruded metal feature. The disclosed method may further include forming a spacer on sidewalls of the dummy gate stack. The method may further include forming a gate electrode in the gate trench after the forming the gate-last metal feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
    a semiconductor substrate having a source region and a drain region, defining a first dimension from the source to the drain; and
    a gate stack disposed on the semiconductor substrate and partially interposed between the source region and the drain region, wherein the gate stack includes:
        a high k dielectric layer disposed on the semiconductor substrate;
        a first metal feature disposed on the high k dielectric layer, the first metal feature having a first work function and defining a second dimension parallel with the first dimension; and
        a second metal feature doped with impurities to have a second work function close to a band edge of an energy band and different from the first work function and defining a third dimension parallel with the first dimension, the third dimension being less than the second dimension.

2. The device of claim 1, wherein the first work function is close to a mid gap of an energy band.

3. The device of claim 1, wherein the second metal feature is disposed on the first metal feature.

4. The device of claim 1, wherein the second feature is partially embedded in the first metal feature.

5. The device of claim 1, further comprising a gate electrode disposed on the second metal feature.

6. The device of claim 1, further comprising: a first spacer formed on sidewalls of the gate stack; and
    a seal spacer interposed between the gate stack and the first spacer and being functional to seal the high k dielectric material layer and the first metal feature.

7. The device of claim 1, further comprising a buffer layer interposed between the high k dielectric material layer and the first metal feature.

8. The device of claim 1, further comprising an interfacial layer interposed between the semiconductor substrate and the high k dielectric material layer.

9. A semiconductor device, comprising:
    a high k dielectric layer disposed on a semiconductor substrate;
    a first metal feature having a first work function and disposed on the high k dielectric layer;
    a second metal feature doped with impurities to have a second work function close to a band edge of an energy band and different from the first work function and embedded in the first metal feature; and
    a gate electrode disposed on the second metal feature.

10. The device of claim 9, wherein the first metal feature is horizontally extruded from the gate electrode.

11. The device of claim 10, further comprising a seal spacer formed on the extrude portion of the first metal feature and on sidewalls of the first metal feature and the gate electrode.

12. The device of claim 11, further comprising another spacer formed on outer sidewalls of the seal spacer.

13. The device of claim 9, wherein the second metal feature is adjacent the high k dielectric layer.

14. The device of claim 1 in which the second metal feature comprises titanium nitride with a nitrogen concentration different from a nitrogen concentration of the first metal feature.

* * * * *